United States Patent
Parekh

(10) Patent No.: US 7,456,928 B2
(45) Date of Patent: Nov. 25, 2008

(54) SYSTEMS AND METHODS FOR CONTROLLING AMBIENT PRESSURE DURING PROCESSING OF MICROFEATURE WORKPIECES, INCLUDING DURING IMMERSION LITHOGRAPHY

(75) Inventor: Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 283 days.

(21) Appl. No.: 11/214,388

(22) Filed: Aug. 29, 2005

(65) Prior Publication Data
US 2007/0045562 A1    Mar. 1, 2007

(51) Int. Cl.
G03B 27/42    (2006.01)
(52) U.S. Cl. ............................. 355/53; 355/67; 355/72; 355/75; 378/34
(58) Field of Classification Search .................. 355/30, 355/53, 67, 71, 72, 75; 378/34, 35
See application file for complete search history.

(56) References Cited

U.S. PATENT DOCUMENTS

| | | |
|---|---|---|
| 4,346,164 A | 8/1982 | Tabarelli et al. |
| 4,968,375 A | 11/1990 | Sato et al. |
| 5,260,174 A | 11/1993 | Nakazawa et al. |
| 5,452,053 A | 9/1995 | Nozue et al. |
| 5,559,582 A | 9/1996 | Nishi et al. |
| 5,673,208 A | 9/1997 | Meier et al. |
| 5,698,069 A | 12/1997 | Aiyer et al. |
| 5,825,470 A | 10/1998 | Miyai et al. |
| 5,871,584 A | 2/1999 | Tateyama et al. |
| 5,931,722 A | 8/1999 | Ohmi et al. |
| 6,038,015 A | 3/2000 | Kawata |
| 6,063,190 A | 5/2000 | Hasebe et al. |
| 6,266,132 B1 | 7/2001 | Stewart et al. |
| 6,269,517 B1 | 8/2001 | Dornier et al. |
| 6,290,863 B1 | 9/2001 | Morgan et al. |
| 6,459,473 B1 | 10/2002 | Chang et al. |

(Continued)

FOREIGN PATENT DOCUMENTS

EP    0268284    5/1988

(Continued)

OTHER PUBLICATIONS

U.S. Appl. No. 11/189,236, filed Jul. 25, 2005, Benson.

(Continued)

*Primary Examiner*—D. Rutledge
(74) *Attorney, Agent, or Firm*—Perkins Coie LLP

(57) ABSTRACT

Systems and methods for controlling ambient pressure during processing of microfeature workpieces, including during immersion lithography, are disclosed. A system in accordance with one embodiment includes a support configured to carry a microfeature workpiece with a surface of the microfeature workpiece at a support location, and a liquid supply device positioned proximate to the support to dispense liquid at the surface location. The system can further include a generally gas-tight enclosure disposed around at least a portion of the surface location. The enclosure can be coupleable to a vacuum source and can be configured to withstand an internal pressure less than atmospheric pressure. This arrangement can be used in the context of an immersion photolithography system, or other systems for which a liquid is disposed on the surface of the microfeature workpiece.

44 Claims, 3 Drawing Sheets

U.S. PATENT DOCUMENTS

| | | | |
|---|---|---|---|
| 6,466,315 | B1 | 10/2002 | Karpol et al. |
| 6,496,257 | B1 | 12/2002 | Taniguchi et al. |
| 6,529,274 | B1 | 3/2003 | Hickman |
| 6,550,990 | B2 | 4/2003 | Sakurai et al. |
| 6,563,568 | B2 | 5/2003 | Pierrat |
| 6,624,879 | B2 | 9/2003 | Imai et al. |
| 6,666,927 | B2 | 12/2003 | Gindel |
| 6,682,406 | B2 | 1/2004 | Chiou et al. |
| 6,809,794 | B1 | 10/2004 | Sewell |
| 6,817,057 | B2 | 11/2004 | Shirley et al. |
| 6,862,080 | B2 | 3/2005 | Matsui et al. |
| 6,867,844 | B2 | 3/2005 | Vogel et al. |
| 6,970,228 | B1 | 11/2005 | Aoki et al. |
| 2003/0200996 | A1 | 10/2003 | Hiatt et al. |
| 2004/0118184 | A1 | 6/2004 | Violette |
| 2004/0134420 | A1 | 7/2004 | Lei |
| 2004/0154530 | A1 | 8/2004 | Hiatt et al. |
| 2004/0169924 | A1 | 9/2004 | Flagello et al. |
| 2004/0207824 | A1 | 10/2004 | Lof et al. |
| 2004/0211920 | A1 | 10/2004 | Maria Derksen et al. |
| 2004/0263808 | A1 | 12/2004 | Sewell |
| 2005/0024609 | A1 | 2/2005 | De Smit et al. |
| 2005/0028314 | A1 | 2/2005 | Hickman et al. |
| 2005/0042554 | A1 | 2/2005 | Dierichs et al. |
| 2005/0048220 | A1 | 3/2005 | Mertens et al. |
| 2005/0078287 | A1 | 4/2005 | Sengers et al. |
| 2005/0259234 | A1 | 11/2005 | Hirukawa et al. |
| 2005/0264802 | A1* | 12/2005 | Shibata et al. ........... 356/237.5 |
| 2006/0023185 | A1 | 2/2006 | Hazelton et al. |
| 2006/0250588 | A1 | 11/2006 | Brandi |
| 2007/0242242 | A1 | 10/2007 | Nagasaka et al. |
| 2007/0268470 | A1 | 11/2007 | Shibazaki |

FOREIGN PATENT DOCUMENTS

| | | |
|---|---|---|
| EP | 0 605 103 A1 | 7/1994 |
| EP | 1489462 | 12/2004 |
| EP | 1498778 | 1/2005 |
| EP | 1 582 924 A2 | 10/2005 |
| EP | 1681597 | 7/2006 |
| EP | 1739492 | 1/2007 |
| JP | 62122132 | 6/1987 |
| JP | 63-157419 A | 6/1988 |
| JP | 1-171762 | 7/1989 |
| JP | 1-283930 | 11/1989 |
| JP | 5-291400 | 11/1993 |
| JP | 7-302827 | 11/1995 |
| JP | 10-223740 | 8/1998 |
| JP | 10-294261 | 11/1998 |
| JP | 2000-150627 | 5/2000 |
| JP | 1 612 850 A1 | 1/2006 |
| JP | 573040 | 1/2007 |
| KR | 2003056808 | 7/2003 |
| WO | WO-2004/090956 A1 | 10/2004 |

OTHER PUBLICATIONS

U.S. Appl. No. 11/335,251, filed Jan. 18, 2006, Manning.
U.S. Appl. No. 11/432,153, filed May 10, 2006, Hickman.
U.S. Appl. No. 11/432,160, filed May 10, 2006, Hickman.
Chang, K., "When There is Splish, but No Splash," 1 page, New York Times, Apr. 5, 2005.
International Search Report and Written Opinion for International Application No. PCT/US2006/028044, Mar. 19, 2007, 15 pages.

* cited by examiner

SYSTEMS AND METHODS FOR CONTROLLING AMBIENT PRESSURE DURING PROCESSING OF MICROFEATURE WORKPIECES, INCLUDING DURING IMMERSION LITHOGRAPHY

TECHNICAL FIELD

The present invention is directed generally to systems and methods for controlling ambient pressure during processing of microfeature workpieces, including during immersion lithography.

BACKGROUND

Photolithography is a common technique used for manufacturing microelectronic circuits and other microfeature devices. In a typical photolithographic process, a microfeature workpiece (e.g., a silicon wafer) is coated with a photosensitive material. Selected portions of the photosensitive material are then exposed to a radiation beam, while neighboring portions are protected from exposure to the radiation by a mask. As a result of being exposed to the radiation, the selected portions can become resistant to a photoresist etchant, or susceptible to the photoresist etchant. Accordingly, when the workpiece is exposed to the photoresist etchant, the photosensitive material is removed from either the exposed regions or the protected regions. The photosensitive material remaining on the workpiece can protect the workpiece material underneath during a subsequent process, such as an etching process for removing material from the workpiece. Using this technique, material can be selectively removed from some portions of the workpiece but not others, allowing the formation of structures (e.g., circuit elements and conductive lines and/or vias) in the workpiece.

FIG. 1 is a partially schematic illustration of a photolithographic system 10 configured in accordance with the prior art. The system 10 includes a workpiece support 11 that carries a microfeature workpiece 30 beneath a lens system 20. An upper surface 31 of the workpiece 30 is selectively exposed to radiation passing along a radiation path 42 through a series of lenses, including a terminal lens 21. The region between the terminal lens 21 and the workpiece surface 31 is filled with a liquid volume 53, forming an immersion lens system. The liquid in the liquid volume 53 can include water or another liquid having a relatively high index of refraction. Accordingly, the photolithographic system 10 can image smaller features on the workpiece 30 than would be possible if the region between the lens 21 and the workpiece surface 31 were filled with air.

In operation, the workpiece support 11 scans or steps the workpiece 30 relative to the lens 21 by moving sequentially along transverse axes A and B. As the workpiece support 11 moves, liquid is continuously supplied to the liquid volume 53 through one or more supply ports 51 and removed from the liquid volume 53 through one or more return ports 52. The roles of the supply ports 51 and the return ports 52 can be reversed when the motion of the workpiece support 11 reverses. In this manner, the liquid volume 53 can remain in a generally fixed location relative to the terminal lens 21 as the workpiece 30 moves relative to the terminal lens 21.

The terminal lens 21 can be supported at a selected distance away from the upper surface 31 of the workpiece 30 by an air bearing 9. Accordingly, the air bearing 9 can include a plurality of air bearing nozzles 8 through which air is injected downwardly toward the upper surface 31, forming an air cushion 7 between the lens system 20 and the workpiece upper surface 31. Vacuum ports 6 are positioned around the periphery of the liquid volume 53 to withdraw residual fluid that may remain on the workpiece upper surface 31 after it contacts the liquid volume 53. The vacuum ports 6 can also be used to secure a cover over the terminal lens 21 when the system 10 is not in use.

One drawback with the foregoing arrangement is that the liquid provided to the liquid volume 53 can splash when it initially strikes the upper surface 31. The impact of the liquid on the upper surface 31 can scatter droplets outwardly from the region directly beneath the terminal lens 21. These droplets can leave stains or other marks on the upper surface 31 after the droplets themselves evaporate. This may be the case even when highly purified water is used to form the liquid volume 53. The remaining marks can interfere with downstream processes, reducing the efficiency and/or effectiveness of these processes, and therefore the overall process of forming microelectronic features in the workpiece 30.

DETAILED DESCRIPTION

A. Introduction

Figure 1:
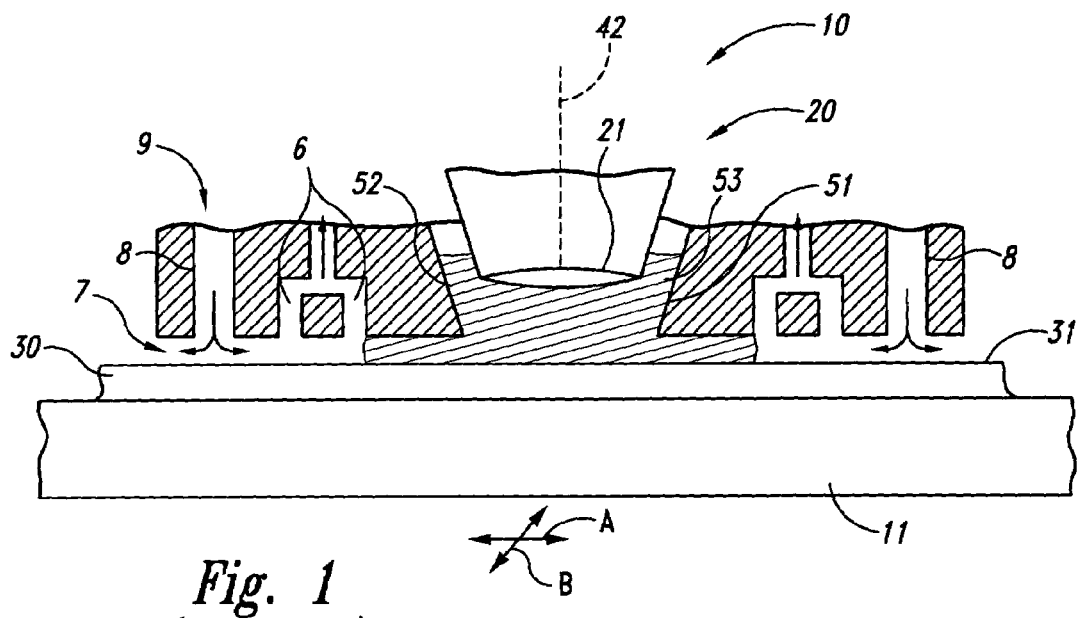
FIG. 1 is a partially schematic, side elevational view of a photolithography system configured in accordance with the prior art.

The following disclosure describes several embodiments of systems and methods for controlling the ambient pressure during processing of microfeature workpieces, including during immersion lithography. One such device, directed toward photolithographic processing can include a support configured to carry a microfeature workpiece with a surface of the microfeature workpiece at a surface location. A radiation system can be positioned proximate to the support to direct radiation along a radiation path toward the support. The photolithography system can further include an immersion lens system that in turn has a lens (with at least one of the lens and support movable relative to the other), and a liquid supply device. The liquid supply device can include at least one liquid supply port positioned to deliver a liquid to the surface location proximate to the lens, while at least one of the support or the lens moves relative to the other. The liquid supply device can further include a liquid return port positioned proximate to the at least one liquid supply port to remove liquid at least proximate to the surface location. A generally gas-tight enclosure can be disposed around at least a portion of the surface location. The enclosure can be coupleable to a vacuum source and can be configured to withstand an internal pressure less than atmospheric pressure.

In a further particular aspect of the invention, the system can include an enclosure that is positioned around the entire surface location, and the enclosure can form a generally gas-tight volume that includes the surface location and the lens. The enclosure can further include a flexible portion positioned to accommodate relative motion between the support and the lens, with the support being movable relative to the lens.

Other aspects of the invention are directed to systems for processing microfeature workpieces, and can include a support configured to carry a microfeature workpiece with a surface of the microfeature workpiece at a surface location, and a liquid supply device positioned proximate to the support to dispense liquid at the surface location. The system can further include a generally gas-tight enclosure disposed around at least a portion of the surface location, with the enclosure being coupleable to a vacuum source and being configured to withstand an internal pressure less than atmospheric pressure. The liquid supply device can include a photoresist dispenser, a photoresist developer supply, and/or an etchant supply. The support can be configured to carry a microfeature wafer, a printed circuitboard, or an LCD panel.

Aspects of the invention are also directed to methods for processing microfeature workpieces. A method in accordance with one aspect of the invention is directed toward irradiating a microfeature workpiece by supporting the microfeature workpiece and dispensing a liquid volume on a surface of the microfeature workpiece in an environment for which the pressure is less than atmospheric pressure. The method can further include directing radiation along a radiation path, through a lens, and through the liquid volume to the microfeature workpiece while the liquid volume is in contact with the lens and the microfeature workpiece at less than atmospheric pressure. In further aspects, dispensing the liquid volume can include at least inhibiting the liquid from splashing when it impacts the microfeature workpiece. The liquid can be selected to have a surface tension less than that of water. For example, the liquid can include an alcohol. The liquid volume can be dispensed over less than the entire surface of the microfeature workpiece, or over the entire surface of the microfeature workpiece.

A method in accordance with another aspect of the invention includes supporting a microfeature workpiece and dispensing a liquid volume on a surface of the microfeature workpiece at a target location of the microfeature workpiece, wherein the target location has a pressure less than atmospheric pressure. The method can further include exposing the microfeature workpiece to the liquid volume while the pressure at the target location is less than atmospheric pressure. Dispensing the liquid volume can include dispensing a liquid photoresist material, a liquid photoresist developer material, an etchant, or a liquid that is in contact with both a lens and the microfeature workpiece simultaneously.

As used herein, the terms "microfeature workpiece" and "workpiece" refer to substrates in and/or on which microelectronic devices are integrally formed and/or carried. Typical micro-devices include microelectronic circuits or components, thin-film recording heads, data storage elements, microfluidic devices, and other products, including support substrates for such components (e.g., printed circuitboards, LCDs and/or flat panel displays). Micromachines and micromechanical devices are included within this definition because they are manufactured using much of the same technology that is used in the fabrication of the integrated circuits and associated substrates. Substrates can be semiconductive pieces (e.g., dope silicon wafers or gallium arsenide wafers), nonconductive pieces (e.g., various ceramic substrates), or conductive pieces. In some cases, the workpieces are generally round, and in other cases, the workpieces have other shapes, including rectilinear shapes (e.g., for printed circuitboards, LCDs and/or flat panel displays). Several embodiments of systems and methods for carrying out processes, including photolithographic processes, on workpieces are described below. A person skilled in the relevant art will understand, however, that the invention may have additional embodiments, and that the invention may be practiced without several of the details of the embodiments described below with reference to FIGS. 2-6.

Figure 2:
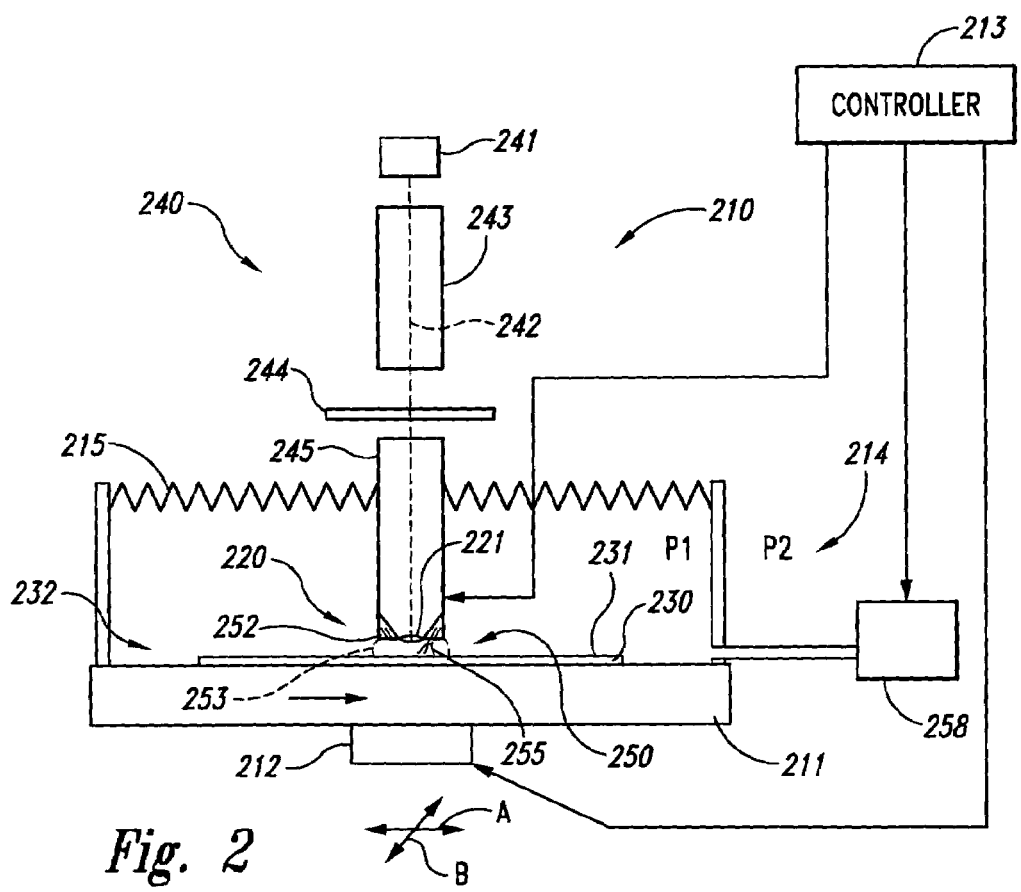
FIG. 2 is a partially schematic, side elevational view of a photolithography system having an enclosure in which the ambient pressure at the surface of a workpiece can be controlled.

B. Systems and Methods for Dispensing Liquids for Microfeature Workpiece Processing FIG. 2 is a schematic illustration of a processing system 210 (e.g., a photolithography system) configured in accordance with an embodiment of the invention. The system 210 can include a support 211 that carries a microfeature workpiece 230 for exposure to selected radiation. The support 211 scans or steps along orthogonal axes A and B, as discussed above, to expose the microfeature workpiece 230 to the radiation. The radiation can have a wavelength suitable for photolithographic applications, for example, 157 nanometers, 193 nanometers, 248 nanometers, or 365 nanometers. An upper surface 231 of the microfeature workpiece 230 can be positioned at a surface location 232 (e.g., a surface plane). A radiation system 240 and a lens system 220 provide, control, and direct the radiation so as to focus the radiation at the surface location 232. Accordingly, the radiation system 240 can include a radiation source 241 that directs radiation along a radiation path 242 that extends to and through a mask 244 via first optics 243. The radiation proceeds along the radiation path 242 via second optics 245 through the lens system 220 to the microfeature workpiece 230.

The lens system 220 can include a liquid immersion lens arrangement having a terminal lens 221 positioned above the microfeature workpiece 230. A liquid supply device 250 directs a liquid 255 into the gap between the terminal lens 221 and the workpiece upper surface 231. Accordingly, the liquid 255 forms a liquid volume 253 positioned between and in contact with both the microfeature workpiece 230 and the terminal lens 221. While the liquid 255 is dispensed on the microfeature workpiece 230, the microfeature workpiece 230 can be positioned in a pressure-controlled enclosure 214 having an internal pressure P1 that is less than an external pressure P2 (e.g., an atmospheric pressure). Accordingly, when the liquid 255 impinges on a target location of the workpiece 230, it can have a reduced tendency (or no tendency at all) to splash and form droplets that may scatter over the upper surface 231 of the microfeature workpiece 230.

As shown in FIG. 2, the enclosure 214 can include a conformable portion 215 that is operatively coupled to both the lens system 220 and the support 211. Accordingly, the conformable portion 215 can accommodate relative motion between these two components of the system 210. For example, in one embodiment, the conformable portion 215 can include a resilient bellows arrangement that allows the actuator 212 to move the support 211 by an amount sufficient to bring every portion of the upper surface 231 of the workpiece 230 directly beneath the terminal lens 221. In another embodiment, the conformable portion 215 can include a multitude of sealably overlapped rigid plates that are slideable relative to each other, or another suitable arrangement. In any of these embodiments, the conformable portion 215, while remaining sufficiently conformable to accommodate the relative motion (e.g., lateral motion) between the support 211 and the lens system 220, is also resilient enough to withstand a pressure differential (e.g., P2 minus P1) between the region within the enclosure 214 and the region external to the enclosure 214. The relative motion between the support 211 and the lens system 220 can be provided by an actuator 212 that moves the support 211 in the orthogonal directions indicated by arrows A and B. In other embodiments, the lens system 220 itself can move.

The pressure P1 within the enclosure 214 can be controlled by a vacuum source 258. The pressure differential between the interior and exterior of the enclosure 214 can have a variety of values depending upon the particular process performed within the enclosure 214. For example, in at least some embodiments, the pressure P1 within the enclosure 214 can be half that of the pressure outside the enclosure (e.g., the pressure differential P2–P1 across the enclosure 214 can be 0.5 atmospheres). In other embodiments, this value can be different. For example, the interior pressure P1 can be about twenty percent or less of the exterior pressure P2 (e.g., the pressure differential can be about 0.8 atmospheres or more). In any of these embodiments, the pressure differential can be low enough to reduce the tendency for the liquid 255 to splash when it strikes the microfeature workpiece 230, without being so low as to cause an inordinate amount of the liquid to boil away or otherwise enter the vapor phase while in the enclosure 214.

By disposing the liquid 255 in a reduced pressure environment, the effective surface tension of the liquid 255 can be reduced, which can at least contribute to a reduced tendency for the liquid to splash when it strikes the workpiece 230. In particular embodiments, the liquid itself can also be selected to have a particular surface tension. For example, in one embodiment, the liquid 255 can include highly purified water, while in other embodiments, the liquid 255 can be selected to have a surface tension less than that of water. Examples of such liquids include alcohols or other liquids that have both a relatively low surface tension and an index of refraction suitable for positioning between the microfeature workpiece 230 and the terminal lens 221.

Figure 3:
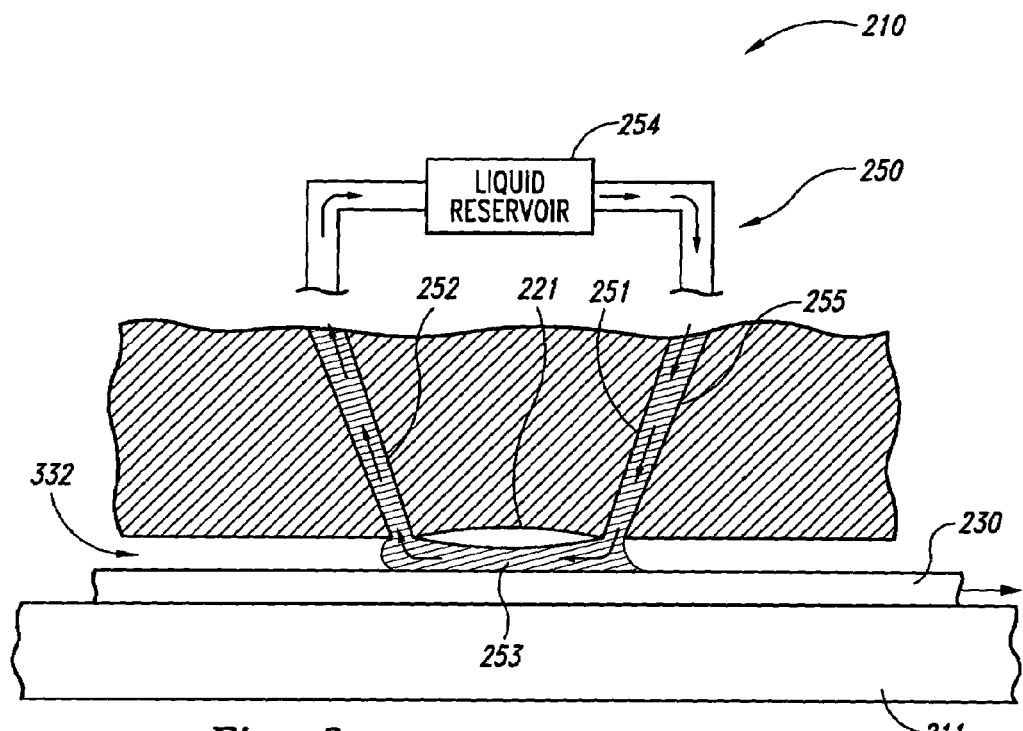
FIG. 3 is an enlarged, partially schematic, side elevational view of an embodiment of the system shown in FIG. 2.

FIG. 3 is an enlarged, partially schematic illustration of a portion of the photolithographic system 210 and the microfeature workpiece 230 shown in FIG. 2. The system 210 can include a liquid supply device 250 that provides the liquid 255 to the liquid volume 253 via a liquid reservoir 254 and a liquid supply port 251. The liquid 255 can be returned to the reservoir 254 via a liquid return port 252, or the liquid 255 can be removed entirely from the system via the liquid return port 252. In either embodiment, the liquid supply device 250 can be configured to supply and remove liquid from the liquid volume 253 as the microfeature workpiece 230 moves beneath the terminal lens 221. As the microfeature workpiece 230 moves, the liquid volume 253 can be contained in the region directly beneath the terminal lens 221, by the action of the liquid return port 252, and/or by another device (e.g., a "squeegee" or other mechanical sealing device) that does not interfere with the low pressure environment created adjacent to the upwardly facing surface of the workpiece 230, and also does not damage the microfeature workpiece 230. The motion of the support 211 (and the workpiece 230), as well as the operation of the liquid supply device 250 and the vacuum source 258 can be directed by a controller 213.

Figure 4:
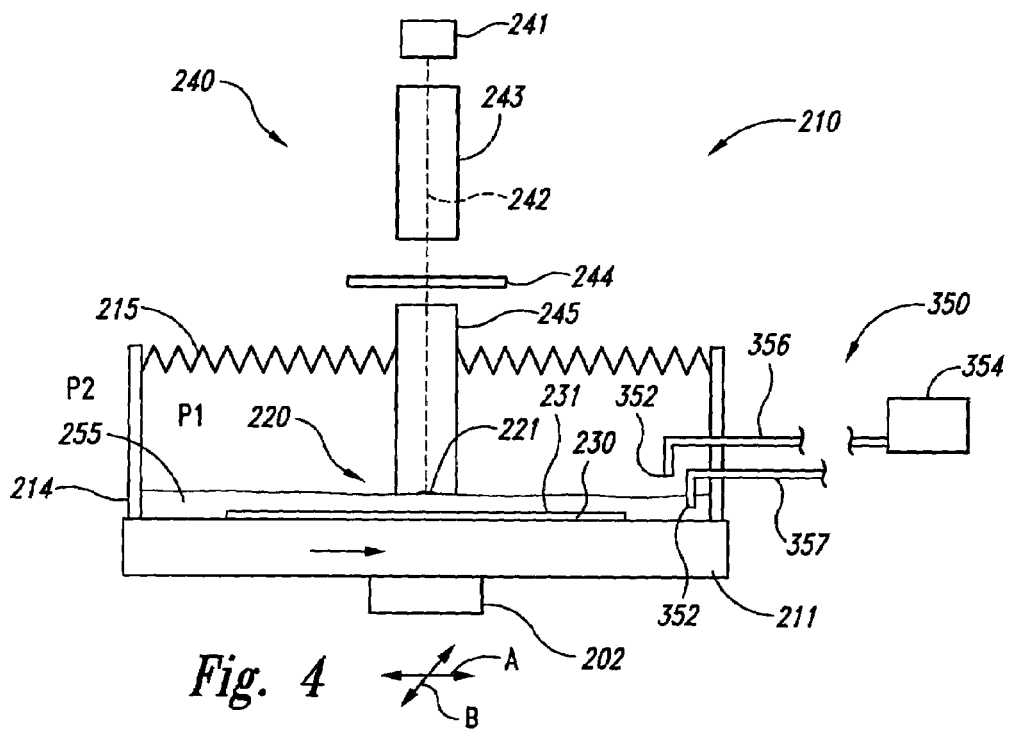
FIG. 4 is a partially schematic, side elevational view of a system for dispensing fluids on a microfeature workpiece in a controlled pressure environment, in accordance with another embodiment of the invention.

In other embodiments, for example, an embodiment shown in FIG. 4, the system 210 can include a liquid supply device 350 that is configured to cover at least approximately the entire upper surface 231 of the workpiece 230 simultaneously. Accordingly, the liquid supply device 350 can include a dispense conduit 356 having a dispense nozzle 352 positioned at least proximate to the workpiece location 232 to dispense the liquid 255 over generally the entire surface of the workpiece 230. A return conduit 357 can be positioned proximate to the workpiece location 232 and can include a return port 352 located to withdraw the liquid from the enclosure 214. Because the liquid 255 in the enclosure 214 may have a reduced surface tension as a result of the decreased pressure P1 within the enclosure 214, it may have an increased tendency to readily cover the surface 231 of the microfeature workpiece 230. The enclosure 214 can include a conformable portion 215 generally similar to any of those described above with reference to FIG. 2 to allow for relative motion between the support 211 and the terminal lens 221.

Figure 5:
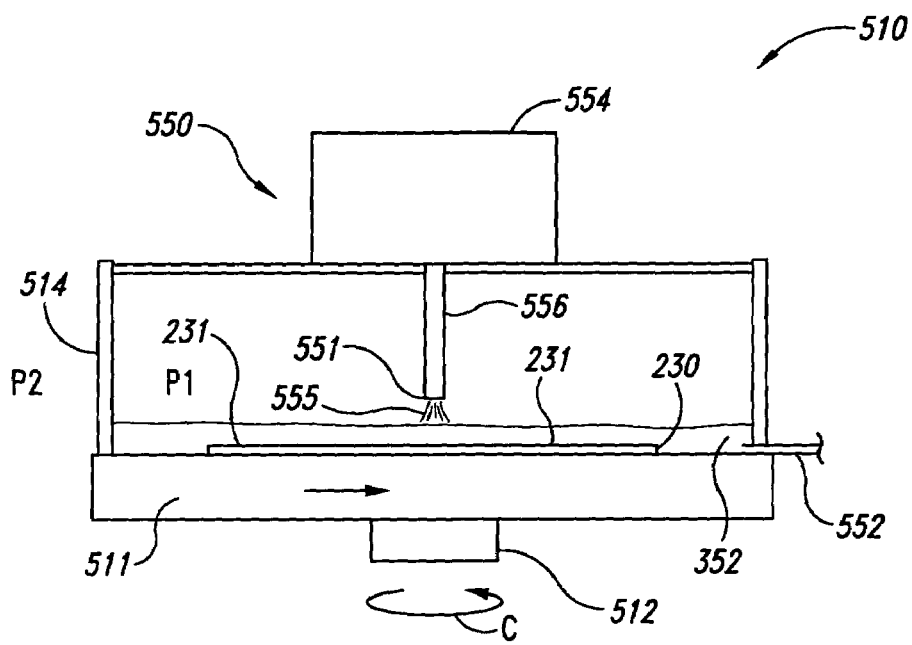
FIG. 5 is a partially schematic, side elevational view of a system for dispensing fluids (e.g., photoresist) on a microfeature workpiece in accordance with still another embodiment of the invention.

In still further embodiments, the pressure of an environment in which liquid is dispensed onto the surface of a microfeature workpiece 230 can be controlled in contexts other than immersion photolithography systems. For example, FIG. 5 illustrates a system 510 in which a different liquid 555 (e.g., a liquid photoresist) is dispensed on the microfeature workpiece 230 while the microfeature workpiece 230 is carried by a support 511. In this particular embodiment, the support 511 can be rotated (as indicated by arrow C) to aid in distributing the liquid 555 over the upper surface 231. Accordingly, the support 511 can be coupled to a rotary actuator 512. The support 511 can also carry an enclosure 514 that provides a boundary between the relatively low pressure area within the enclosure 514 and the higher pressure area outside the enclosure 514. In a particular aspect of this embodiment, the enclosure 514 need not, include a flexible portion to account for relative motion between the liquid supply device and the support 511. Instead, the liquid 555 can be provided by a liquid supply device 550 that is carried by the enclosure 514 or otherwise has a fixed position relative to the enclosure 514. The liquid supply device 550 can include a reservoir 554 coupled to a dispense conduit 556 having a dispense nozzle 551 that disposes the liquid 555 on the microfeature workpiece 230. In one aspect of this embodiment, the dispense conduit 556 can include a single dispense nozzle 551 and in other embodiments, the liquid supply device 550 can include multiple dispense nozzles 551. In any of these embodiments, the system 510 can further include a return port 552 positioned to remove excess liquid 555 after a dispense operation has been completed.

As described above, the introduced liquid 555 can include a photoresist solution in one embodiment. In other embodiments, the introduced liquid can include a photoresist developer for patterning previously-deposited photoresist solution. In still further embodiments, the introduced liquid 555 can include an etchant, and/or can have other compositions.

Figure 6:
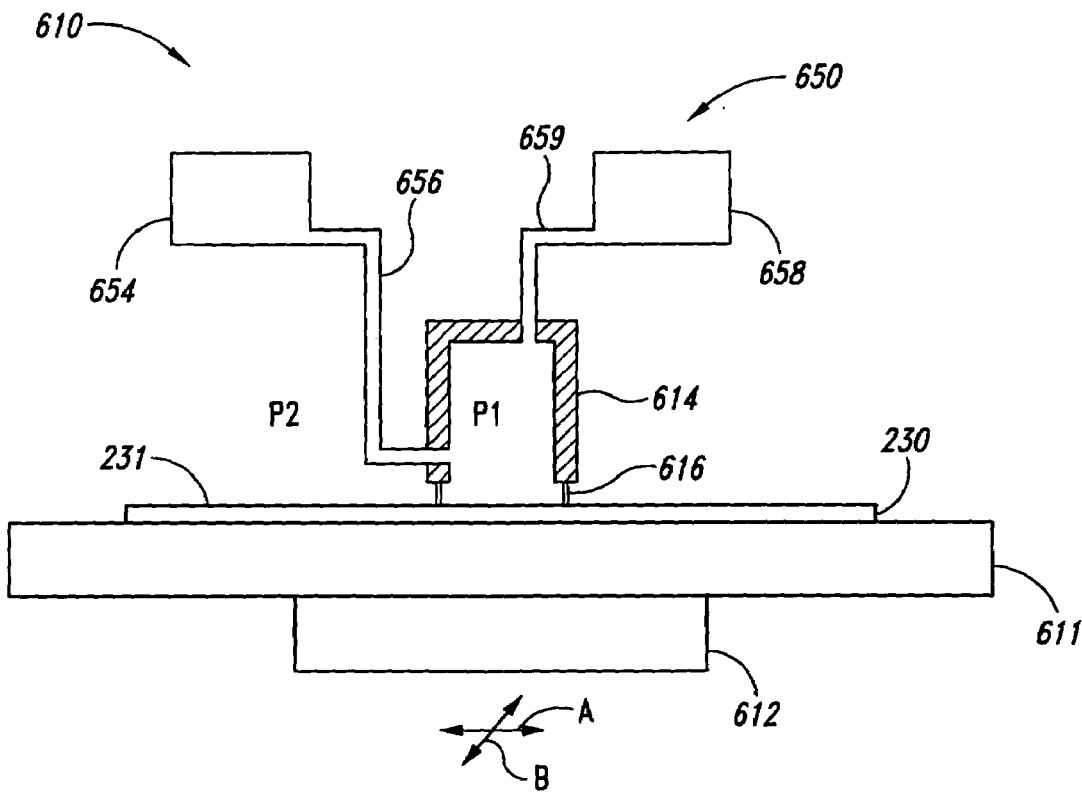
FIG. 6 is a partially schematic, side elevational view of a system for dispensing a liquid over a limited area of a microfeature workpiece, and in a controlled pressure environment, in accordance with yet another embodiment of the invention.

In an embodiment described above with reference to FIG. 3, the extent to which the liquid was disposed over the upper surface 231 of the microfeature workpiece 230 was controlled by the action of a liquid return port and a liquid supply port. In other embodiments, other devices can be used to control the extent to which the liquid flows over the upper surface 231. For example, FIG. 6 illustrates a processing apparatus 610 that includes an enclosure sized to cover only a portion of the upper surface 231. The enclosure 614 can include a seal 616 that at least partially seals an environment within the enclosure 614 from an environment external to the enclosure 614. Accordingly, the pressure P1 within the enclosure 614 can be controlled to be at a level below the pressure P2 external to the enclosure 614. In one aspect of this embodiment, the seal 616 can include a flexible resilient material that makes physical contact with the microfeature workpiece 230. In other embodiments, the seal 616 can have a labyrinth or baffle configuration that can maintain the pressure differential between the region within the enclosure 614 and the region external to the enclosure 614.

A liquid supply device 650 can deliver liquid to the region within the enclosure 614, for example, via a reservoir 654 coupled to a supply line 656. A vacuum source 658 can communicate with the enclosure 614 via a vacuum line 659 to reduce the pressure within the enclosure 614. The workpiece 230 can be carried by a support 611, which is in turn moved by an actuator 612. In one aspect of this embodiment, the actuator 612 can move the support 611 in orthogonal directions, as indicated by axes A and B. In another embodiment, the actuator 612 can rotate the support 611 in a manner generally similar to that described above with reference to FIG. 5. In still further embodiments, the workpiece support 611 can remain stationary while the enclosure 614 moves over the surface of the workpiece 230.

In one mode of operation, the support 611 can be moved relative to the enclosure 614 in a systematic fashion to sequentially expose the entire surface of the workpiece 230 to the liquid contained by the enclosure 614. In other embodiments, the enclosure 614 can be moved relative to the support 611. In still a further mode of operation, the enclosure 614 and the workpiece 230 can be positioned relative to each other to provide only isolated local treatment of a particular area of the workpiece 230. For example, this arrangement can be used to selectively etch a particular region of the workpiece 230 without exposing other regions of the workpiece to the etchant. In other embodiments, this arrangement can be used to expose the workpiece 230 to substances other than etchants.

From the foregoing, it will be appreciated that specific embodiments of the invention have been described herein for purposes of illustration, but that various modifications may be made without deviating from the invention. For example, the flexible portions of the enclosures shown in the Figures may have other arrangements in other embodiments. Aspects of the invention described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

I claim:

1. A photolithography system for microfeature workpieces, comprising:
    a support configured to carry a microfeature workpiece with a surface of the microfeature workpiece at a surface location;
    a radiation system positioned proximate to the support to direct radiation along a radiation path toward the support;
    an immersion lens system that includes:
        a lens, wherein at least one of the lens and the support is movable relative to the other; and
        a liquid supply device having at least one liquid supply port positioned to deliver a liquid to the surface location in contact with the lens while at least one of the support and the lens moves relative to the other, the liquid supply device further including a liquid return port positioned proximate to the at least one liquid supply port to remove liquid at least proximate to the surface location; and
    a generally gas-tight enclosure disposed around at least a portion of the surface location, the enclosure being coupleable to a vacuum source and being configured to withstand an internal pressure less than atmospheric pressure.

2. The system of claim 1 wherein the liquid supply device includes a liquid reservoir containing a liquid having a surface tension less than that of water.

3. The system of claim 1 wherein the liquid supply device includes a liquid reservoir containing an alcohol.

4. The system of claim 1 wherein the enclosure is configured to withstand a pressure differential of at least 0.5 atmospheres.

5. The system of claim 1 wherein the enclosure is configured to withstand a pressure differential of at least 0.8 atmospheres.

6. The system of claim 1 wherein the support is movable relative to the lens.

7. The system of claim 1 wherein the enclosure is positioned around the entire surface location.

8. The system of claim 1 wherein the enclosure is positioned around the entire surface location, and wherein the enclosure forms a generally gas-tight volume that includes the surface location and the lens, further wherein the enclosure includes a conformable portion positioned to accommodate relative motion between the support and the lens, and wherein the support is movable relative to the lens.

9. The system of claim 1, further comprising the gas source coupled to the enclosure.

10. A system for processing microfeature workpieces, comprising:
    a support configured to carry a microfeature workpiece with a surface of the microfeature workpiece at a surface location;
    a radiation system positioned proximate to the support to direct radiation alone a radiation path toward the support;
    an immersion lens system that includes:
        a lens, wherein at least one of the support and the liquid supply device is movable relative to the other; and
        a liquid supply device positioned proximate to the support to dispense liquid at the surface location in contact with the lens while at least one of the support and the liquid supply device moves relative to the other; and
    a generally gas-tight enclosure disposed around at least a portion of the surface location, the enclosure being coupleable to a vacuum source and being configured to withstand an internal pressure less than atmospheric pressure.

11. The system of claim 10 wherein the support is housed within the enclosure.

12. The system of claim 10 wherein the enclosure is positioned around the entire surface location.

13. The system of claim 10 wherein the enclosure is positioned around a portion of the surface location, and wherein the enclosure includes a seal configured to sealably contact a microfeature workpiece carried at the surface location.

14. The system of claim 10 wherein the support is configured to carry a microfeature wafer.

15. The system of claim 10 wherein the support is configured to carry a printed circuit board.

16. The system of claim 10 wherein the support is configured to carry an LCD panel.

17. The system of claim 10 wherein the liquid supply device includes a photoresist dispense system.

18. The system of claim 10 wherein the liquid supply device includes a photoresist developer supply.

19. The system of claim 10 wherein the liquid supply device includes an etchant supply.

20. The system of claim 10, further comprising the vacuum source coupled to the enclosure.

21. The system of claim 10, wherein the liquid supply device includes at least one liquid supply port positioned to deliver a liquid to the surface location proximate to the lens while the support moves the microfeature workpiece relative to the lens, the liquid supply device further including a liquid return port positioned proximate to the at least one liquid supply port to remove liquid at least proximate to the surface location.

22. A system for processing microfeature workpieces, comprising:
   a support configured to carry a microfeature workpiece with a surface of the microfeature workpiece at a surface location;
   radiation source means for directing radiation along a radiation path toward the support;
   an immersion lens system that includes:
      a lens, wherein at least one of the lens and the support is movable relative to the other; and
      liquid supply means positioned proximate to the support to dispense liquid at the surface location in contact with the lens while at least one of the support and the lens moves relative to the other; and
   pressure control means for controlling a pressure at an interface between a portion of the liquid through which radiation is directed and the surface of the microfeature workpiece to be less than atmospheric pressure.

23. The system of claim 22 wherein the pressure control means includes a generally gas-tight enclosure positioned around the surface location.

24. The system of claim 22 wherein at least one of the support and the liquid supply means is movable relative to the other.

25. The system of claim 22 wherein at least one of the support and the liquid supply means is movable relative to the other, and wherein the support is housed within the pressure control means.

26. The system of claim 22 wherein the support is configured to carry a microfeature workpiece.

27. The system of claim 22, wherein the liquid supply means includes at least one liquid supply port positioned to deliver a liquid to the surface location in contact with the lens while the support moves the microfeature workpiece relative to the lens, the liquid supply means further including a liquid return port positioned proximate to the at least one liquid supply port to remove liquid at least proximate to the surface location, and wherein the pressure control means includes means for accommodating relative motion between the support and the lens.

28. A method for irradiating a microfeature workpiece, comprising:
   supporting a microfeature workpiece;
   dispensing a liquid volume on a surface of the microfeature workpiece in an environment for which the pressure is less than atmospheric pressure; and
   directing radiation along a radiation path, through a lens and through a portion of the liquid volume to the microfeature workpiece while the portion of the liquid volume in contact with the lens and the microfeature workpiece is at less than atmospheric pressure, and while at least one of the microfeature workpiece and the lens moves relative to the other.

29. The method of claim 28 wherein directing radiation includes directing the radiation while recovering liquid from the liquid volume and replenishing liquid in the liquid volume.

30. The method of claim 28 wherein dispensing a liquid volume includes dispensing the liquid volume with a surface tension of liquid in the liquid volume less than it would be at atmospheric pressure.

31. The method of claim 28 wherein dispensing a liquid volume includes dispensing the liquid volume while at least inhibiting the liquid from splashing when it impacts the microfeature workpiece.

32. The method of claim 28 wherein dispensing a liquid volume includes dispensing the liquid volume while preventing the liquid from splashing when it impacts the microfeature workpiece.

33. The method of claim 28 wherein dispensing a liquid volume includes dispensing a liquid having a surface tension less than a surface tension of water.

34. The method of claim 28 wherein dispensing a liquid volume includes dispensing an alcohol.

35. The method of claim 28 wherein dispensing a liquid volume includes dispensing a liquid volume to cover at least approximately the entire surface of the microfeature workpiece simultaneously.

36. The method of claim 28 wherein dispensing a liquid volume includes dispensing the liquid volume over less than the entire surface of the microfeature workpiece.

37. The method of claim 28 wherein dispensing a liquid volume includes dispensing the liquid volume over less than the entire surface of the microfeature workpiece and at least restricting motion of liquid in the liquid volume over the surface of the microfeature workpiece.

38. The method of claim 28 wherein dispensing a liquid volume includes dispensing a liquid volume over a first region of the microfeature workpiece and moving the microfeature workpiece relative to the liquid portion to expose a second region of the microfeature workpiece to the liquid volume.

39. The method of claim 28 wherein dispensing a liquid volume includes dispensing a liquid photoresist material.

40. The method of claim 28 wherein dispensing a liquid volume includes dispensing a liquid photoresist developer material.

41. The method of claim 28 wherein dispensing a liquid volume includes dispensing the liquid volume through a supply port to cover a first portion of an the surface of the microfeature workpiece, and wherein the method further comprises moving at least one of the microfeature workpiece and the supply port relative to the other to move the liquid volume to a second portion of the surface of the microfeature workpiece.

42. The method of claim 28, further comprising:
   placing the microfeature workpiece in a generally gas-tight enclosure prior to dispensing the liquid volume;
   reducing a pressure within the enclosure;
   dispensing the liquid volume on the microfeature workpiece while the microfeature workpiece is located in the enclosure and while the pressure is less than atmospheric pressure; and
   removing the microfeature workpiece from the enclosure after dispensing the liquid volume.

43. The method of claim 28, further comprising controlling a first region of the surface of the microfeature workpiece to be at a first pressure less than atmospheric pressure while a second region of the surface is at a second pressure greater than the first pressure.

44. The method of claim 43 wherein disposing a liquid volume includes disposing an etchant at the first region of the upwardly facing surface.

* * * * *

UNITED STATES PATENT AND TRADEMARK OFFICE
CERTIFICATE OF CORRECTION

PATENT NO.       : 7,456,928 B2                                    Page 1 of 1
APPLICATION NO.  : 11/214388
DATED            : November 25, 2008
INVENTOR(S)      : Kunal R. Parekh It is certified that error appears in the above-identified patent and that said Letters Patent is hereby corrected as shown below:

In column 8, line 31, in Claim 10, delete "alone" and insert -- along --, therefor.

In column 10, line 42, in Claim 41, after "portion of" delete "an".

Signed and Sealed this

Third Day of March, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,456,928 B2 | Page 1 of 1 |
| APPLICATION NO. | : 11/214388 | |
| DATED | : November 25, 2008 | |
| INVENTOR(S) | : Kunal R. Parekh | |

It is certified that error appears in the above-identified patent and that said Letters Patent is hereby corrected as shown below:

Title page, item [56], under the U.S. PATENT DOCUMENTS heading on Page 2, please add:

5,610,683    3/1997    Takahashi ........355/53

Signed and Sealed this
Seventeenth Day of July, 2012

David J. Kappos
*Director of the United States Patent and Trademark Office*